(12) United States Patent
Bartolome et al.

(10) Patent No.: US 12,457,808 B2
(45) Date of Patent: Oct. 28, 2025

(54) PHOTON DETECTOR ARRAY ASSEMBLY

(71) Applicant: Texas Instruments Incorporated, Dallas, TX (US)

(72) Inventors: Eduardo Bartolome, Dallas, TX (US); Rakul Viswanath, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/312,948

(22) Filed: May 5, 2023

(65) Prior Publication Data

US 2023/0275176 A1   Aug. 31, 2023

Related U.S. Application Data

(62) Division of application No. 16/884,812, filed on May 27, 2020, now Pat. No. 11,682,745.

(51) Int. Cl.
| | |
|---|---|
| *H01L 21/48* | (2006.01) |
| *H01L 21/56* | (2006.01) |
| *H01L 23/00* | (2006.01) |
| *H10F 30/00* | (2025.01) |
| *H10F 30/10* | (2025.01) |
| *H10F 39/00* | (2025.01) |
| *H10F 39/18* | (2025.01) |
| *H10F 71/00* | (2025.01) |

(52) U.S. Cl.
CPC .......... *H10F 30/10* (2025.01); *H01L 21/4846* (2013.01); *H01L 21/568* (2013.01); *H01L 24/19* (2013.01); *H10F 30/301* (2025.01); *H10F 39/182* (2025.01); *H10F 39/184* (2025.01); *H10F 39/189* (2025.01); *H10F 39/809* (2025.01); *H10F 39/811* (2025.01); *H10F 71/00* (2025.01)

(58) Field of Classification Search
CPC ... H01L 31/09; H01L 21/4846; H01L 21/568; H01L 24/19; H01L 27/14634; H01L 27/14636; H01L 31/085; H01L 31/18
See application file for complete search history.

(56) References Cited

U.S. PATENT DOCUMENTS

| | | |
|---|---|---|
| 9,596,421 B1 | 3/2017 | Itzler |
| 10,057,521 B1 | 8/2018 | Sanchez et al. |

(Continued)

OTHER PUBLICATIONS

Ron Leckie and Howard Lenos, "CZT Detectors: Converging assembly technologies open new application opportunities," Chip Scale Review, Oct./Nov. 2009, article, accessed May 27, 2020, www.icproto.com/pdf/CSR_2009-OctNov-111309_CZT.pdf.
"Flip Chip Ball Grid Array Package Reference Guide," Texas Instruments Incorporated, Literature No. SPRU811A, May 2005, Manual, accessed May 27, 2020, http://www.ti.com/lit/ug/spru811a/spru811a.pdf?ts=1590599031678.

(Continued)

*Primary Examiner* — Jeff W Natalini
*Assistant Examiner* — Brandon C Fox
(74) *Attorney, Agent, or Firm* — Xiaotun Qiu; Frank D. Cimino

(57) ABSTRACT

In a described example, an apparatus includes: a photon detector array with a first signal output pad coupled to a photon detector array pixel; a die carrier comprising a readout integrated circuit (ROIC) die and a conductor layer having conductors that couple a first signal input pad on the conductor layer to an input signal lead of the ROIC die; and the first signal output pad coupled to the first signal input pad.

35 Claims, 8 Drawing Sheets

(56) References Cited

U.S. PATENT DOCUMENTS

| | | | |
|---|---|---|---|
| 2003/0173523 A1* | 9/2003 | Vuorela | H01L 27/14634 |
| | | | 250/370.13 |
| 2017/0141040 A1* | 5/2017 | Yu | H01L 24/00 |
| 2017/0230597 A1 | 8/2017 | Fahim et al. | |
| 2018/0151502 A1* | 5/2018 | Lin | H01L 23/5286 |
| 2019/0104267 A1 | 4/2019 | Kobayashi | |
| 2019/0317287 A1 | 10/2019 | Raghunathan et al. | |
| 2019/0333957 A1* | 10/2019 | Kim | H01L 24/16 |
| 2020/0321375 A1 | 10/2020 | Wu | |
| 2021/0091005 A1* | 3/2021 | Tsai | H01L 21/565 |
| 2021/0242117 A1* | 8/2021 | Hung | H01L 21/6835 |
| 2022/0173033 A1* | 6/2022 | Kuo | H01L 24/08 |
| 2022/0181264 A1* | 6/2022 | Lu | H01L 23/13 |

OTHER PUBLICATIONS

"Innovations in Wafer Level Technology: A proven leader in Wafer Level Packaging Technology: A new paradigm in Wafer Level Manufacturing: FlexLineTM," STATSChipPAC, Nov. 2018, flyer, accessed May 27, 2020, https://www.statschippac.com/wp-content/uploads/2018/11/Stats_eWLB_OverviewFlyer.pdf.

Seung Wook Yoon et al, "Flipchip eWLB (embedded Wafer Level Ball Grid Array) Technology as Innovative 2.5D Packaging Solutions", STATSChipPAC Ltd., Singapore, 2013 Electronic Systems Technologies Conference, 2013, paper, accessed on May 27, 2020, https://www.statschippac.com/wp-content/uploads/2018/11/STATSChipPAC_IPC_ESTC2013_Flipchip_eWLB.pdf.

* cited by examiner

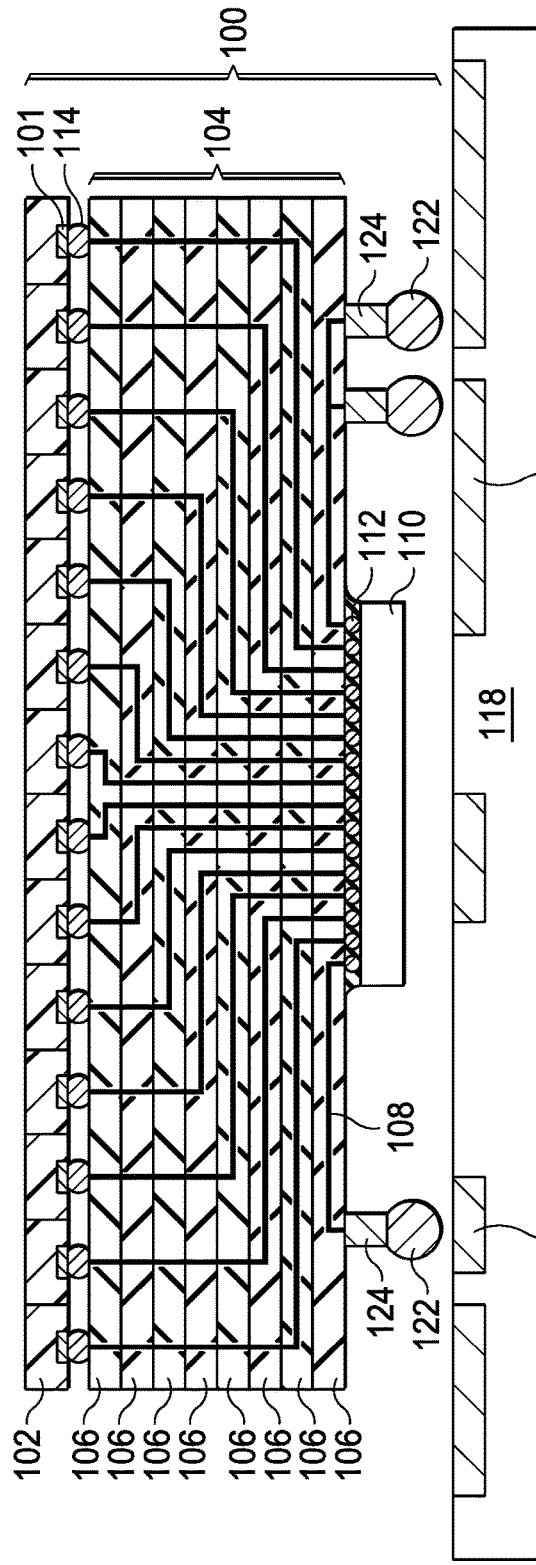
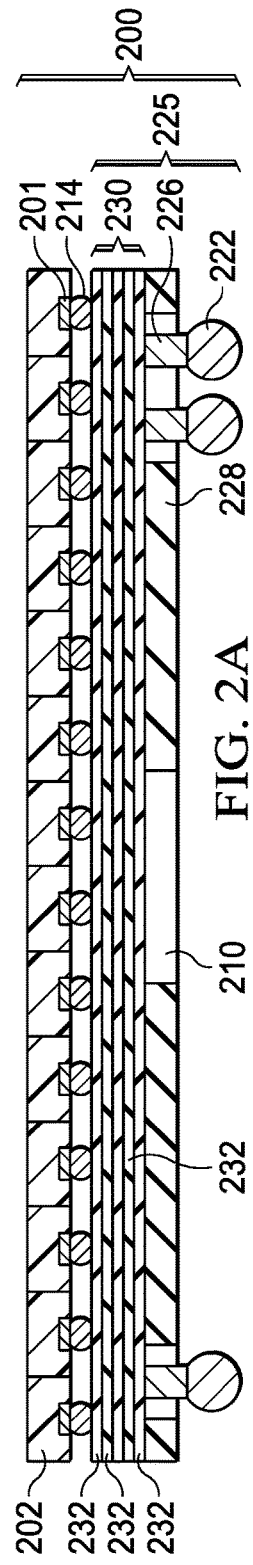
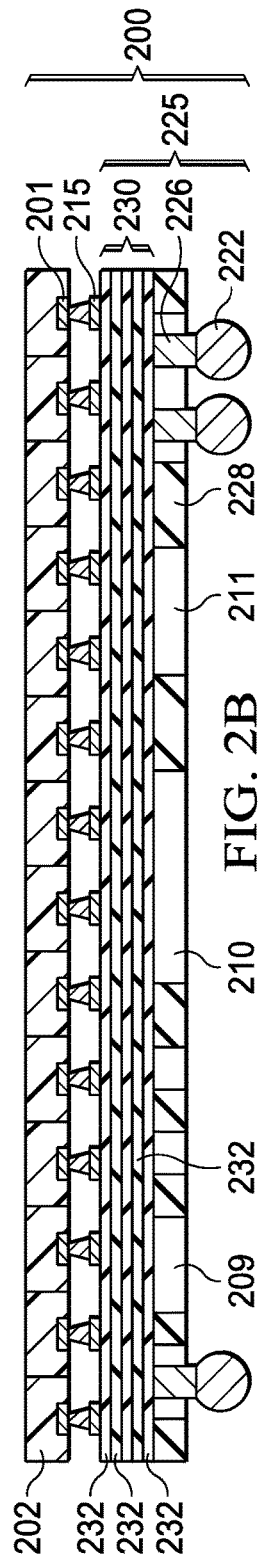
FIG. 1
FIG. 2A
FIG. 2B

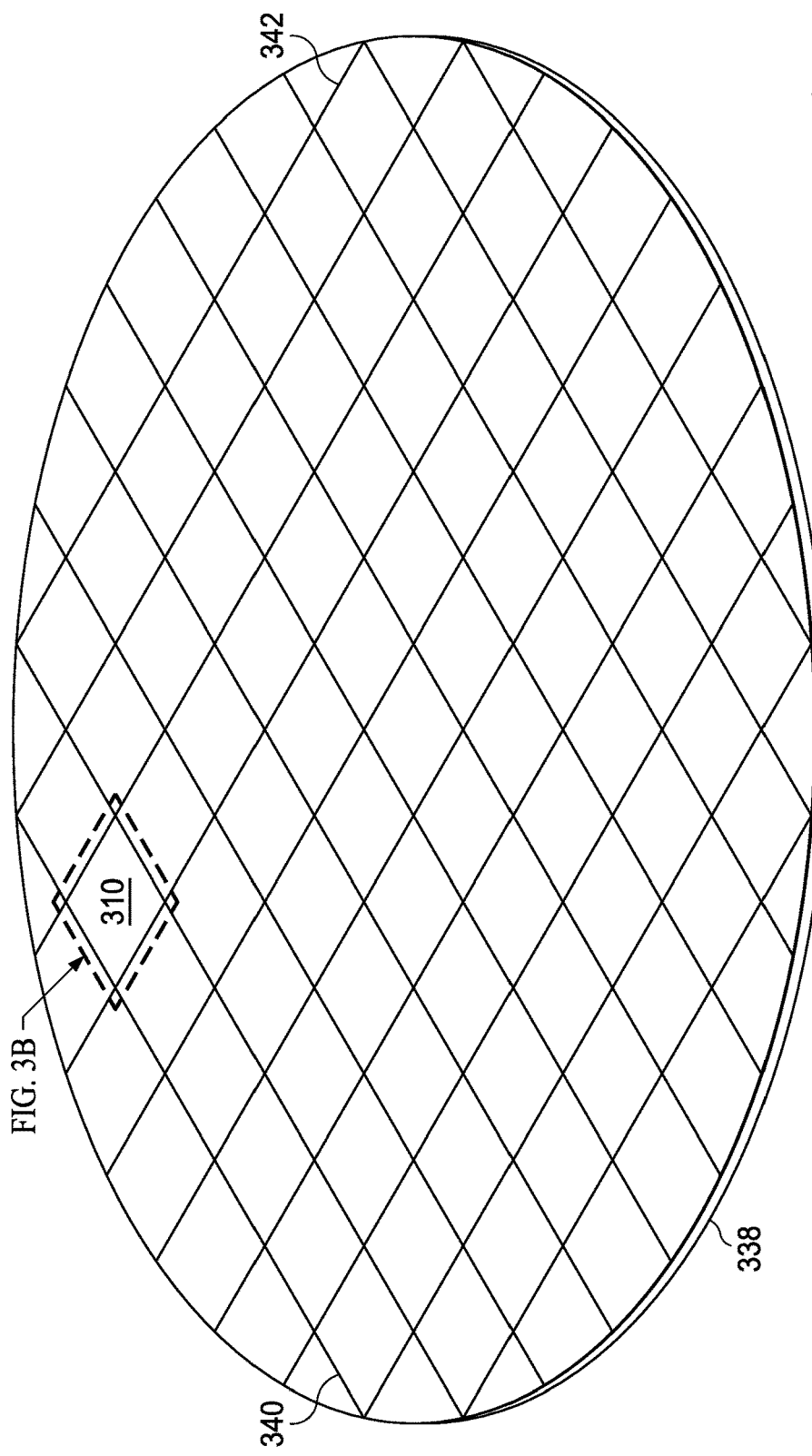
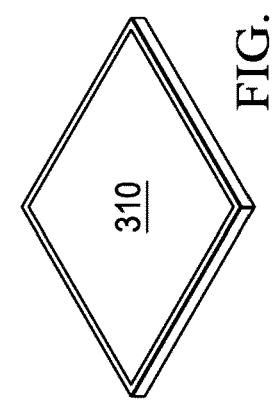
FIG. 3A
FIG. 3B

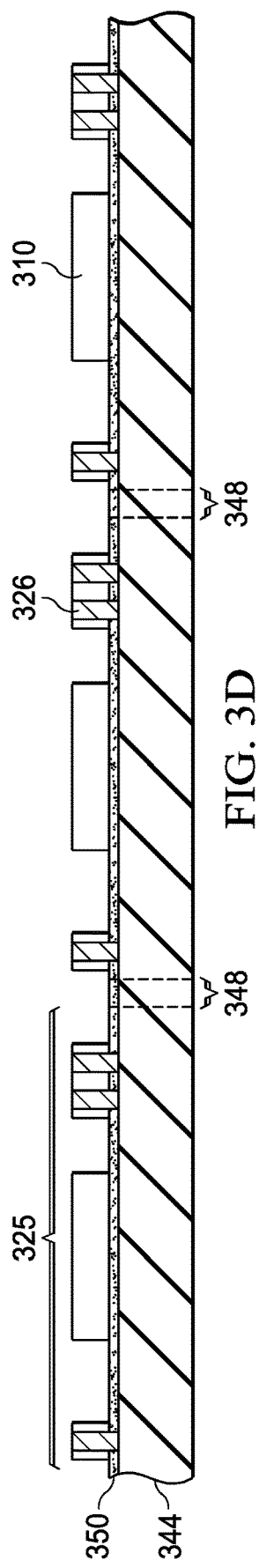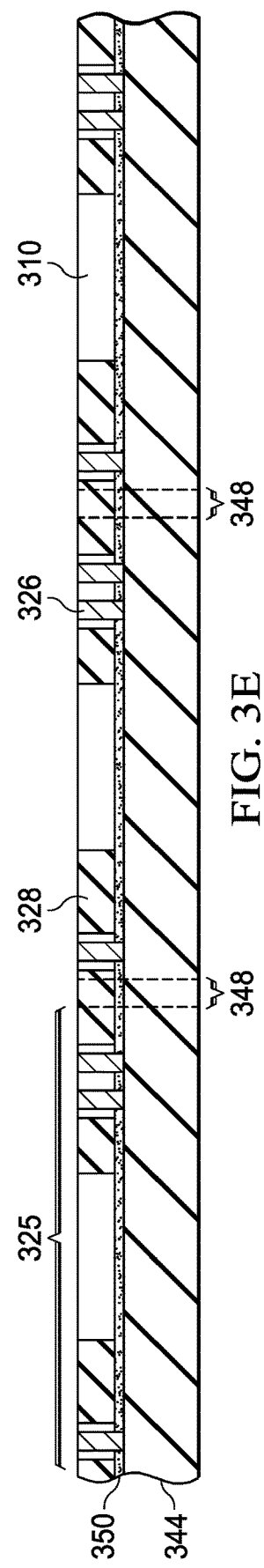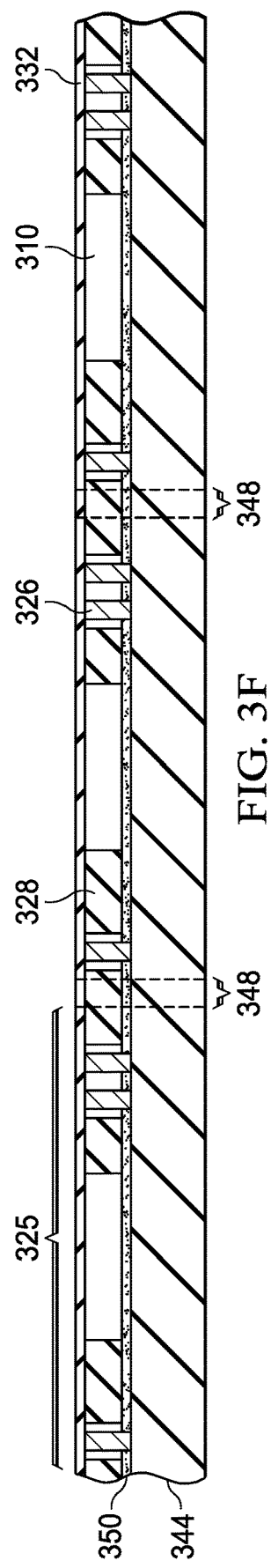

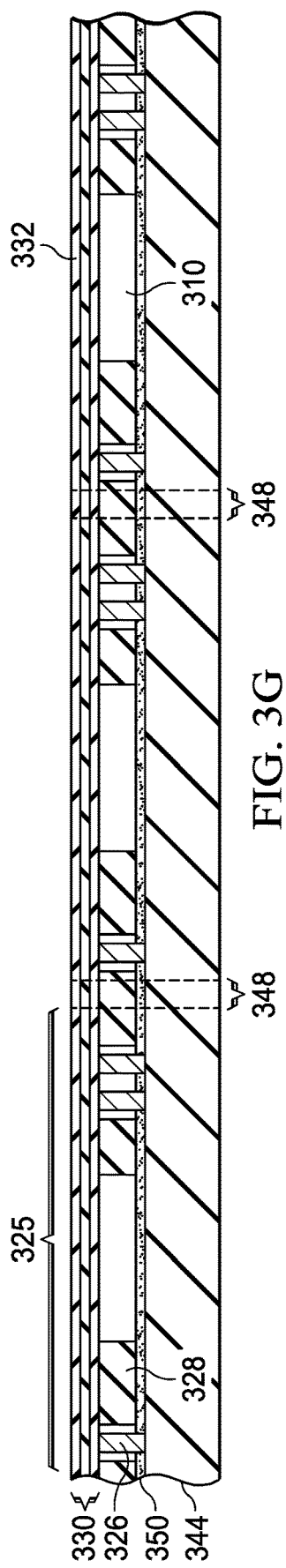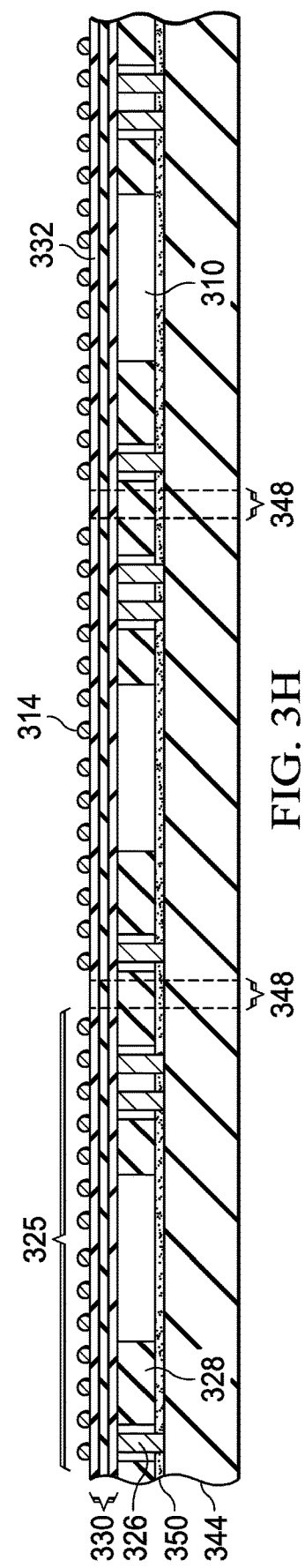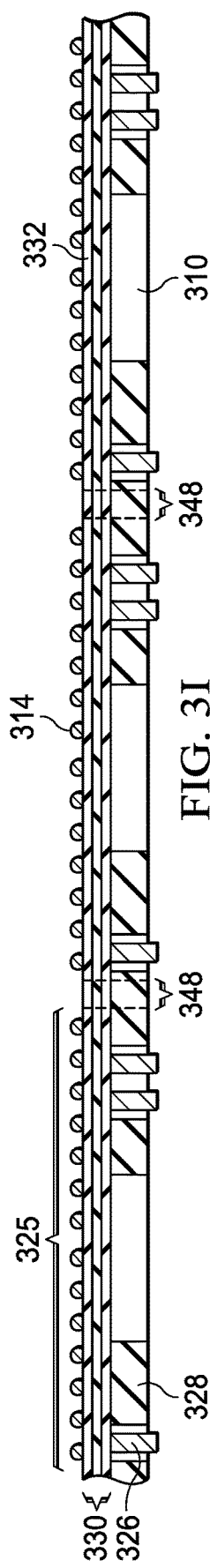

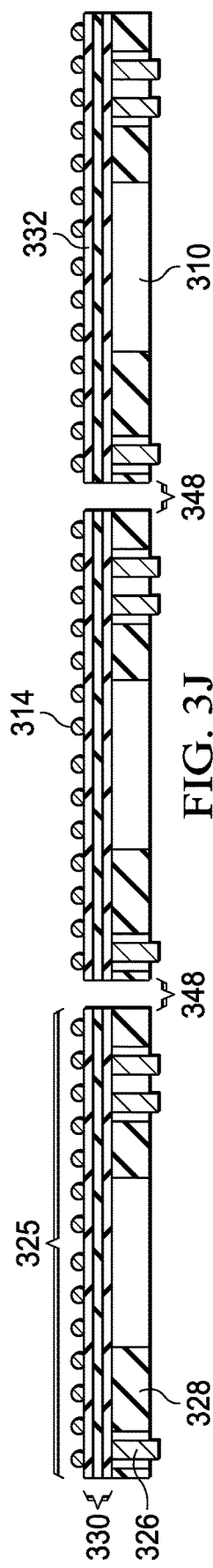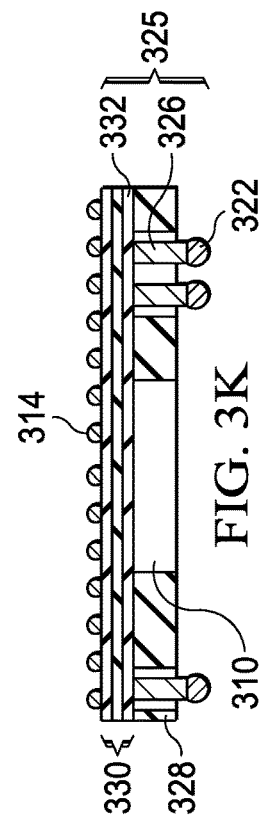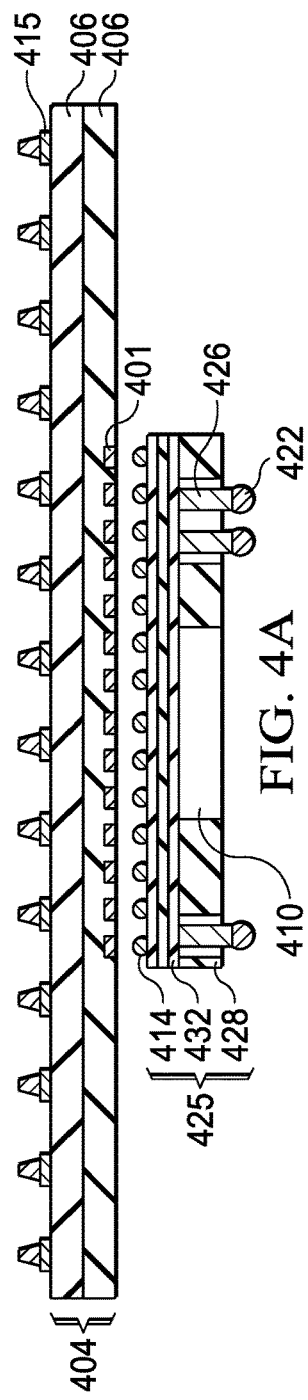
FIG. 3J
FIG. 3K
FIG. 4A

PHOTON DETECTOR ARRAY ASSEMBLY

CROSS-REFERENCE TO RELATED APPLICATIONS

The present application is a division of U.S. patent application Ser. No. 16/884,812, filed on May 27, 2020, the contents of which are herein incorporated by reference in its entirety.

TECHNICAL FIELD

This disclosure relates generally to photon detector array assemblies, such as are used for computed tomography (CT) applications.

BACKGROUND

Photon detector arrays are used to capture photons. In an application the captured photons may form an image of an object. Photon detectors are used for computed tomography applications. Photon detectors can also be used, for example, in light detection and ranging (LIDAR) applications. The photons can be infrared, visible, ultraviolet, or x-ray. A photon detector array can contain over a thousand pixels. Each pixel in the photon detector array captures photons and converts them into an electrical signal. The size of a pixel determines, at least in part, the resolution of the image. Higher resolution photon detector arrays require a smaller pixel size. For imaging large objects, such as a human body in a (CT) scanner, several individual detector arrays, each with a thousand pixels or more, are joined together at the edges to form an array of detector arrays. To enable individual detector arrays to be joined together without unwanted intervening spaces and having a desired, or in some examples uniform, pixel spacing, the signal flow through the photon detector array is three dimensional (3D). Photons enter pixels on the topside of the photon detector array and electrical signals (output signals) exit from the bottom side of the photon detector array. An interposer, which can be composed of multiple layers of interconnect, can couple the output electrical signal from each pixel to a lead that is coupled to a signal amplifier in a read out integrated circuit (ROIC). An input signal lead on the topside of the interposer is connected to an output signal from each detector pixel. Additional leads on the bottom side of the interposer provide the means to mount the photon detector array assembly on an underlying substrate. The additional leads also provide power and control signals to the photon detector array assembly and transmit processed image signals from the photon detector array assembly to an imaging system such as a CT scanner.

SUMMARY

In a described example, an apparatus includes: a photon detector array with a first signal output pad coupled to a photon detector array pixel; a die carrier comprising a readout integrated circuit (ROIC) die and a conductor layer having conductors that couple a first signal input pad on the conductor layer to an input signal lead of the ROIC die; and the first signal output pad coupled to the first signal input pad.

BRIEF DESCRIPTION OF THE DRAWINGS

FIG. 1 is a cross sectional view of a photon detector array assembly with an interposer coupling an integrated circuit to a photon detector array.

FIGS. 2A-2B are cross sectional views of example arrangements forming photon detector array assemblies with a photon detector array coupled to a die carrier.

FIGS. 3A-B are a projection view of a semiconductor wafer and a close up view of a die from the semiconductor wafer, FIGS. 3D-3K are a series of cross sectional views illustrating the steps in forming a die carrier including an integrated circuit and a conductor layer.

FIGS. 4A-4D are cross sectional views of a photon detector array assembly with an interposer coupling a die carrier with a conductor layer to a photon detector array.

DETAILED DESCRIPTION

Figure 3C:
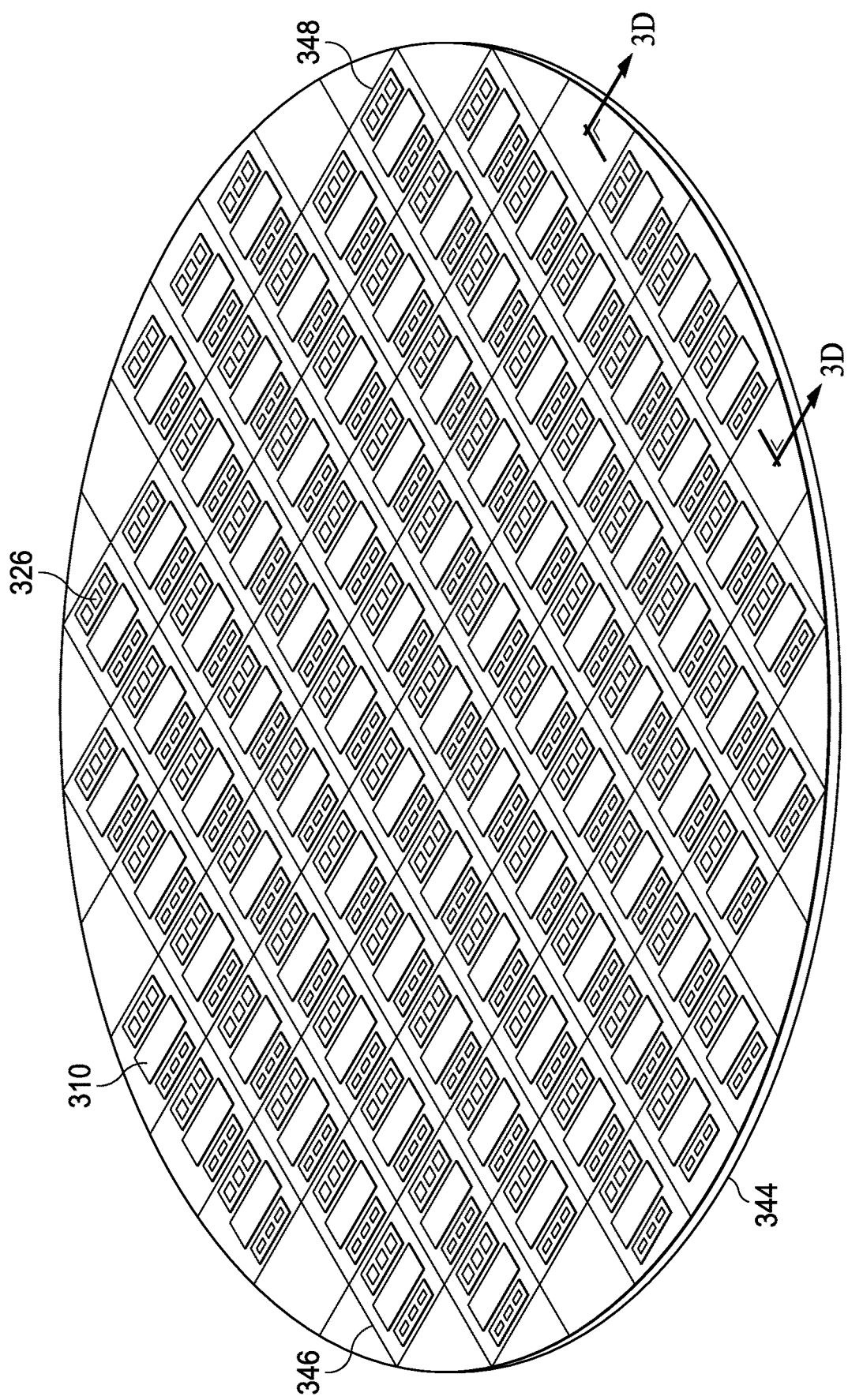
FIG. 3C is a projection view of a reconstituted wafer with integrated circuit dies spaced by mold compound.

Corresponding numerals and symbols in the different figures generally refer to corresponding parts, unless otherwise indicated. The figures are not necessarily drawn to scale.

In this description, the term "die carrier" is used. As used herein, a die carrier includes at least one dielectric layer having conductive lands on a board side surface, and having external terminals such as solder balls, copper columns or stud bumps on the conductive lands. At least one semiconductor die is disposed in or on the dielectric layer and has bond pads forming integrated circuit terminals, with routing conductors in the dielectric layer used to couple the integrated circuit terminals to the conductive lands and thus to the external terminals. In example arrangements, a read-out integrated circuit (ROIC) die is disposed in a die carrier and has inputs coupled to lands on a sensor side surface of the die carrier for mounting a photon detector array or an interposer carrying a photon detector array, and has outputs coupled to external terminals of the die carrier on an opposing board side surface. The arrangement including the photon detector array and the ROIC can then be mounted to a system board.

The term "interposer" is used herein. As used herein, an interposer is a substrate with a first set of conductive lands on a first planar surface and a second set of conductive lands on a second opposing planar surface. The interposer can include conductive connectors such as solder bumps, solder balls, copper pillar bumps, or stud bumps on the conductive lands on one or both surfaces. The interposer electrically connects two or more components. In one example arrangement, an interposer connects a photon detector array on a first surface of the interposer with a read out integrated circuit (ROIC) die disposed in a die carrier that is connected to a second surface of the interposer opposite the first surface. The interposer can include conductive through vias and can include multiple levels of conductors spaced by insulating material, the multiple levels of conductors connecting the conductive lands on the first surface to the conductive lands on the second surface. The multiple levels of conductors can be connected through the levels using filled vias. The interposer can be formed of organic material such as epoxy mold compound, films, laminates, or other dielectrics. The interposer can be made from silicon or other semiconductor materials. In some arrangements, an interposer can have different technology connectors on different surfaces. For example, a gold bump device can be mounted to gold bumps on a first surface of the interposer, while a copper bump device can be mounted to copper lands or bumps on a second opposing surface of the interposer.

The term "readout integrated circuit" or "ROIC" is used herein. As used herein, a readout integrated circuit is an integrated circuit configured to receive signals from a photon detector array and to output corresponding digital signals for use in a system. The ROIC has inputs corresponding to the outputs of the photon detector array and can have amplifiers coupled to the inputs and can have one or more outputs that can output data corresponding to the signals from the photon detector array. In the arrangements, the ROIC is provided as a semiconductor die. In an example arrangement, an ROIC die has about one thousand inputs for coupling to a photon detector array. The photon detector array in this example has about one thousand pixels and about one thousand outputs. Other arrangements can have different numbers of pixels, inputs, and outputs, for example in one arrangement there are eight hundred sixty-four pixels in a photon detector array with eight hundred sixty four outputs and an ROIC die is used with eight hundred sixty four inputs coupled to the eight hundred sixty four outputs of the detector array In an example the ROIC die outputs digital signals on a data bus to deliver digital data corresponding to the photon detector array outputs. For example, the digital outputs may be on a four bit wide or eight bit wide data bus. Other digital format data bus connections can be used to transmit the digital data output by the ROIC.

In this description, the term "stud bumps" is used. As used herein, a stud bump is a structure formed on a conductive land such as a bond pad using a thermocompression process. In one example the stud bump is formed using a wire bonder. A ball is formed at the end of a conductive wire, the ball is thermally compressed onto the conductive land, and the wire is cut as the tool moves away from the bump formed by the compressed ball, leaving a stud extending a predetermined height away from the bump. Stud bumps can be made of gold (Au). Other conductive metals such as silver, palladium, copper, and alloys can be used. In another example a silver alloy including gold and palladium can be used. In one arrangement a photon detector array has gold lands on a planar surface, and gold stud bumps are used on an interposer that the photon detector array is mounted to, this arrangement allows a reliable gold-gold bond connection to be made, which can be made at relatively low temperatures.

In this description, the term "pitch" is used. As used herein, the term pitch means an intended element size plus a predetermined spacing distance between adjacent elements when the elements are arranged in a two-dimensional element array. For example, the pitch of pixels in a photon detector array is the size of each of the pixels plus the uniform spacing distance between adjacent pixels on a two-dimensional photon detector array. The pitch of solder balls is the size of the solder ball plus the predetermined spacing distance between solder balls arranged in a two-dimensional array. The pitch of stud bumps on an interposer is the size of the stud bump plus the distance between adjacent stud bumps arranged in a two-dimensional array. Some variation in pitch will occur due to manufacturing tolerances, but the elements are still said to have the same pitch if a uniform geometry size plus uniform spacing distance is intended. In some arrangements the pitch for the entire array is uniform. In other arrangements, the pitch can be predetermined in the various elements so that the vertical or 3D connections are matched, but the pitch need not be uniform across the entire array.

In this description, the term "photon detector array" is used. As used herein a photon detector array is an array of photosensitive devices arranged in a two dimensional array. In an example, the photon detectors are photodiodes formed using semiconductor manufacturing processes in a layer of semiconductor material. In a particular example, cadmium zinc telluride (CZT) photosensors are used. In a computed tomography (CT) application, CZT photosensors are exposed to X-ray or gamma ray radiation. Cadmium telleride (CdTe) photosensors can be used. Additional photo sensor materials include silicon (Si), gallium arsenide (GaAs), and silicon germanium (SiGe), although these materials may be less useful in a CT application due to the low stopping power for these materials.

A photon detector array assembly 100 is illustrated in a cross-sectional view in FIG. 1. The photon detector array assembly 100 is composed of a photon detector array 102, an interposer 104, and a read out integrated circuit (ROIC) die 110. The photon detector array 102 is mounted on a first side of the interposer 104 and the ROIC die 110 is mounted on a second opposing side of the interposer 104. In this example, each pixel in the photon detector array 102 is connected to a signal amplifier in the ROIC die 110. The interposer 104 can include multiple layers of dielectric 106 with imbedded signal leads 108. Conductive vias can form vertical connections between the layers to allow both horizontal and vertical routing in the interposer 104.

The interposer 104 maps the pitch of the electrical inputs of the ROIC die 110 to the pitch of the signal output bond pads 101 of the photon detector array 102. Power, control, and processed signal output leads 124 on the second side of the interposer are routed through the interposer 104 to the ROIC die 110. Solder balls 122 on the ends of these power, control and processed signal leads 124 form solder bonds for mounting to electrical leads 120 on the substrate 118. The solder balls 122 can be melted to form joints using a thermal reflow process when the photon detector array assembly 100 is mounted to the substrate 118 as part of the data acquisition portion of a system employing the photon detector, such as a CT scanner. On the second side of the interposer 104, leads to the signal amplifiers within the ROIC die 110 are connected to signal leads 108 in the interposer with solder bonds 112. On the first side of the interposer, solder bonds 114, electrically connect signal leads 108 in the interposer 104 to signal output bond pads 101 on the pixels in the photon detector array 102. The pitch of connections to the photon detector array 102 is larger than the pitch of connections to the ROIC die 110, thus the interposer 104 must map the connections between the larger pitch and the smaller pitch and fan out the connections. Several levels of conductors are required to perform the needed redistribution of the signals, making the interposer 104 complex. Noise caused by interconductor coupling can occur, making the transmission of signals difficult in the interposer 104. Capacitance on the conductors in the interposer 104 is higher than desired due to the size of the signal leads 108 in the interposer 104, and this capacitance affects the performance of signal amplifiers within the ROIC die.

In the arrangements, the problem of creating large photon arrays by tiling together multiple photon array package assemblies edge to edge to form the large photon array is solved by using a die carrier formed using semiconductor manufacturing technology with conductor layers. The die carriers are used with the photon detectors to form photon array package assemblies having 3D connections between the photon detector arrays and the ROIC semiconductor dies with low lead-to-lead capacitance. In an example, the photon array package assemblies have uniform pitch with minimum and uniform edge spacing, so that the pitch of the photosensors in the large array is approximately the same between photo array assemblies as the pitch of the photosensors within a single array, to maintain uniform pixel pitch across the larger photon array. By use of the arrangements the photon array package assemblies can be tiled edge to edge with little or no variation in photon detector pitch to make large photon arrays, such as are needed for CT scanners. In alternative arrangements, some non-uniform pitch in the individual elements in the photosensor arrays may be present, however the minimum edge spacing of the arrangements makes tiling of the individual array devices to form a large photosensor array possible.

FIGS. 2A and 2B show example arrangements for photon detector array package assemblies 200 with reduced lead-to-lead capacitance. In FIGS. 2A and 2B, similar reference labels are used for similar elements as are shown in FIG. 1 for clarity. For example, ROIC die 210 in FIGS. 2A and 2B corresponds to ROIC die 110 in FIG. 1. In FIGS. 2A and 2B, a die carrier 225 is used with low lead to lead capacitance in an overlying conductor layer 230. Semiconductor wafer manufacturing technology with lead widths less than one micron is used to manufacture the conductor layer 230 in FIGS. 2A and 2B. The smaller lead widths in the conductor layer 230 (when compared to the lead widths of the conductors in the interposer of FIG. 1 described hereinabove) greatly reduces capacitive coupling between the signal leads. The ROIC die 210/conductor layer 230 assembly is manufactured using processes similar to processes for semiconductor wafer manufacturing, as is further described hereinbelow with respect to FIGS. 3A-3L.

In FIGS. 2A and 2B, the photon detector array 202 is mounted on a first side of the conductor layer 230, and the ROIC die 210 is mounted on a second opposing side of the conductor layer 230. In one example, cadmium zinc telluride (CZT) photon detectors are used. CZT is a semiconductor material that can detect X-ray and gamma radiation at room temperature Medical, industrial and security applications (such as X-ray and CT systems) where X-ray or gamma radiation is applied can use CZT photon detectors to detect the radiation at a room temperature without cooling. Other photon detectors can be used. In another example CdTe photon detectors are used. Detectors for ultra-violet, infrared, visible light, x-ray, and gamma radiation can be used, for example. Additional through leads 226 are connected to the second side of the conductor layer 230 to provide power and control signals to the photon detector array package assembly 200. The through leads 226 also provide processed signal outputs from the photon detector array package assembly 200 to an imaging system such as a CT scanner or X-ray system.

In operation, photons are captured by photon detectors at the first surface (upper surface as oriented in FIGS. 2A and 2B of the photon detector array package assembly 200), and processed image signals exit from the second opposing surface of the photon detector array package assembly 200. The 3D signal flow enables photon detector array assemblies 200 to be tiled together with zero or near zero intervening space between the photon detector array assemblies, enabling the assemblies to form a larger photon array. That is, by tiling together multiple assemblies 200 in a two-dimensional array, a very large photon detector system can be created.

In the die carrier 225 in FIG. 2A, the spaces between the ROIC die 210 and the through leads 226 are filled with a dielectric compound 228. Useful dielectric compounds include filled epoxy or polyimide, such as mold compound. The conductor layer 230 is composed of one or more levels of interconnect 232 (dielectric layer covering metal conductor leads that extend horizontally between dielectric levels, electrically connected through the dielectric levels using filled vias extending through the levels of dielectrics (filled vias not shown for simplicity of illustration)) and is manufactured using semiconductor manufacturing process technology, such as semiconductor interconnect processes. Signal input leads from the surface of the conductor layer 230 on the sensor side of die carrier in FIG. 2A are electrically connected to output signal bond pads 201 on the photon detector array 202 with solder joints 214. Solder joints 214 can be formed by solder bumps or solder balls, or by a conductive column with a solder tip such as a copper column with a solder tip, sometimes referred to as pillar bumps or if made of copper, as copper pillar bumps.

The photon detector array assembly 200 in FIG. 2B is the same as the photon detector array assembly in FIG. 2A except that in FIG. 2B the die carrier 225 is electrically connected to the photon detector array 202 using bonds to stud bumps 215 (instead of solder joints 214 in FIG. 2A). Additional electrical devices 209 and 211 such as integrated circuit dies, and passive devices are also integrated into the 225. Stud bumps 215 are formed on a bond pad using a wire bonding machine, but the stud bumps are formed without attached bond wires. The stud bumps 215 are bonded to the output signal bond pads 201 on the photon detector array 202 using a thermosonic or thermocompression process, or by the use of conductive epoxy. Stud bump bonding produces tighter pitch electrical connections (<50 μm bump to bump pitch) than solder ball bonds (>150 μm ball to ball pitch). Other electronic devices 209 and 211 such as additional signal processing ICs and passive components can be integrated along with the ROIC die 210 into the die carrier 225. The integration of the additional devices in the die carrier enables electrical devices that were heretofore mounted on a system board (such as substrate 118 in FIG. 1) to be integrated into the photon detector array assembly 200. This can improve performance and reduce cost. In an example the stud bumps are gold (Au), in alternative arrangements other conductive materials can be used (copper, palladium, or silver, and alloys of these, for example). Use of gold (Au) stud bumps can be beneficial for mounting sensors with low thermal budgets, because the Au stud bumps melt at a relatively low temperature when compared to other package connection types, such as solder balls. Certain sensor types cannot withstand temperatures used for solder thermal reflow with solder ball processing, for example.

The die carrier manufacturing process is described in FIGS. 3A-3K. In FIGS. 3A-3K similar reference labels are used for similar elements as are shown in FIGS. 2A and 2B, for clarity. For example, the ROIC die 310 in FIGS. 3A-3K corresponds to ROIC die 210 in FIGS. 2A and 2B. A description of the manufacturing steps in FIGS. 3A-3K is provided in the flow diagram FIG. 5.

Semiconductor dies (see ROIC die 310, FIG. 3A) are singulated from a wafer and then the dies are mounted in a reconstituted wafer (see 344, FIG. 3C). Mold compound (see dielectric 328, FIG. 3E) fills gaps between the ROIC dies 310 to form the reconstituted wafer 344. In the arrangements, the conductor layer 330 is formed over the ROIC dies in the reconstituted wafer 344 and with conductors embedded in the conductor layer 330 in electrical contact with the ROIC dies 310, FIG. 3H. Further, through leads 326, (see FIG. 3I), which are preformed elements, are included in the reconstituted wafer 344. The die carrier assemblies including the ROIC dies 310, the through leads 326, and the conductor layer 330 are then singulated to form individual die carrier devices 325, see FIG. 3K.

The ROIC die 310 is manufactured as a die on a semiconductor wafer 338 using a standard semiconductor manufacturing process (see FIG. 3A). The ROIC die 310 can be an application specific integrated circuit (ASIC), a custom integrated circuit, a programmable logic device (PLD) or other circuitry. The ROIC die 310 has inputs configured to receive the outputs of the photon detector array that it will be coupled to. After manufacture of the ROIC die 310 is complete, the ROIC dies 310 are singulated (see step 501, FIG. 5) from the wafer 338 by cutting through the horizontal 340 and vertical 342 scribe lanes (horizontal and vertical scribe lanes as the wafer is oriented in FIG. 3A) which border each ROIC die 310 (see FIG. 3B).

The die carrier 325 wafer reconstitution process is illustrated in FIGS. 3C-3E. Singulated ROIC dies 310 (and optionally, other electrical devices such as passive devices or other dies) and through leads 326 are removably mounted on the surface of a removable substrate to form a reconstituted wafer 344 (step 503). This reconstituted wafer can be additionally processed in a semiconductor manufacturing fab or in a backend facility. The size, shape, and material properties of the removable substrate are chosen to be compatible with standard semiconductor manufacturing equipment and processes. Multiple die carrier assemblies 325 (see FIG. 3D), separated by horizontal 346 and vertical 348 saw streets (as oriented in FIG. 3C, the saw streets are horizontal and vertical relative to the substrate position in the figure), are formed on the removable substrate. The size of a die carrier 325 is determined by cost and functionality considerations, and by the surface area of the corresponding photon detector array. In one example, when a die carrier (see 225 in FIG. 2A) is to be bonded directly to a photon detector array 202 as in FIGS. 2A and 2B, the size of the die carriers 225 and 325 is chosen to be approximately the same as the size of the photon detector array 202. In alternative examples, the die carrier 225 size can be smaller than the size of the photon detector array 202. To maintain the desired pitch and the edge to edge tiling capability of the completed assemblies, the die carrier 325 should not have an area greater than the area of the photon detector array to be mounted to it. In the arrangements, the surface area of the die carrier 325 is less than, or equal to, the surface area of the photon detector array to be mounted to it. The photon detector arrays can then be edge to edge tiled with uniform pixel pitch, without any interference from the die carriers.

A cross section of the reconstituted wafer, showing three die carriers 325 joined together by saw streets 348, is shown in FIG. 3D. This cross section is taken along dashed line D-D' in FIG. 3C. In each die carrier 325, an ROIC die 310 and other electrical devices such as through leads 326 are bonded to the removable substrate using a removable adhesive 350.

In FIG. 3E, a dielectric material 328 such as a filled epoxy or polyimide is used to fill the spaces between the ROIC die 310 and the other electrical devices (step 505 in FIG. 5) providing structural integrity to the die carrier 325. Through leads 326 are also shown surrounded by the dielectric material 328.

In FIGS. 3F and 3G, a conductor layer 330 is composed of one or more interconnect layers 332 (metal conductors covered with dielectric) formed (see step 507) on the ROIC die 310, on the other electrical devices and on the dielectric material 328. The interconnect wires in the conductor layer 330 connect signal amplifier inputs in the ROIC die 310 that are at a tighter (smaller) pitch to signal input pads on the opposing side of conductor layer 330 that are at a looser (larger) pitch. Additional through leads 326 on the ROIC die 310 of the conductor layer 330 provide, for example, power and control signals from a system such as a computed tomography (CT) scanner to the photon detector array apparatus 400 (see FIG. 4B). As is described hereinbelow, the pitch of the signal input pads on the surface of the sensor or non ROIC die 310 of the conductor layer 330 are designed to match the pitch of the signal output pads (see conductive lands 401 in FIG. 4B) on a photon detector array 402 (or the pitch of signal output pads 411 on an interposer 404).

In FIG. 3H solder balls 314 are formed on the non ROIC die 310 surface of the conductor layer 330 to form solder joints that are configured to connect to signal output pads 411 (see FIG. 4A) on an interposer 404. Alternatively, bonds to stud bumps 415 can be used. Stud bump bonds can be gold, but stud bump bonds can also be copper or silver or palladium or alloys of these. In an example arrangement, gold stud bumps are used.

The removable substrate and the adhesive layer 350 are then removed (step 509) from the non-conductor layer 330 side of the die carriers 325 as shown in FIG. 3I. For example, the adhesive 350 may be a UV release adhesive, a peelable release film adhesive, or chemically dissolvable adhesive.

In FIG. 3J, the die carriers 325 are singulated one from another by cutting through the horizontal 346 and vertical 348 saw streets (step 511). A mechanical dicing saw can be used to cut through the reconstituted wafer along the saw streets.

In FIG. 3K, solder balls 322 are formed on the through connectors for power and control signal leads on the board side of the die carriers 325. These solder balls 322 are used to form solder joints when the photon array detector assembly 400 (FIG. 4B), is mounted on a system circuit board 418 (see FIG. 4C). Additional through leads 326 and 426 also convey output processed image signals from the photon detector array assembly (not shown, see 400 in FIGS. 4A-4C) to an imaging system. System circuit board 418 can be implemented as printed circuit board material such as fiber reinforced glass, FR4, BT resin, ceramic, plastic or other carrier materials used for circuitry, including tapes, films, and laminate materials. Flexible materials can be used as well as rigid boards.

Note that some steps in the manufacture of the die carriers as described above in FIGS. 3A-3K and FIG. 5 can be done in different orders, for example, solder balls can be formed on an array of die carriers prior to singulation from the array, instead of afterwards as described. Other variations in the steps or performance of some steps in parallel or in a different order are contemplated as forming alternative arrangements.

Figure 4B:
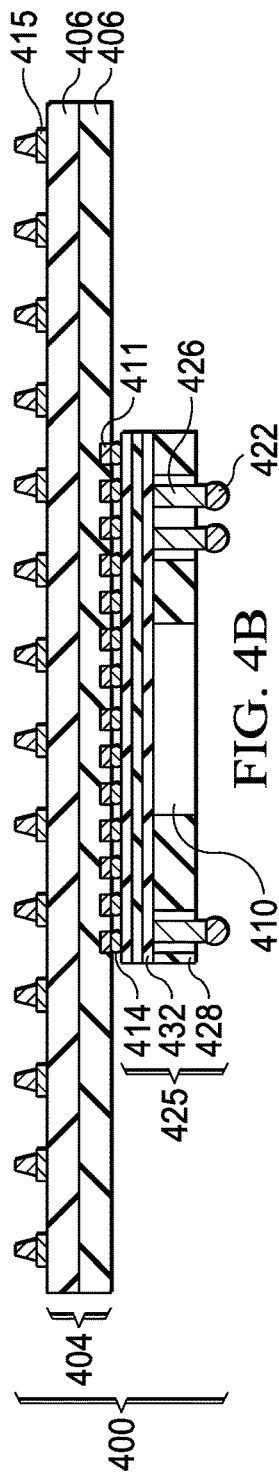
Figure 4C:
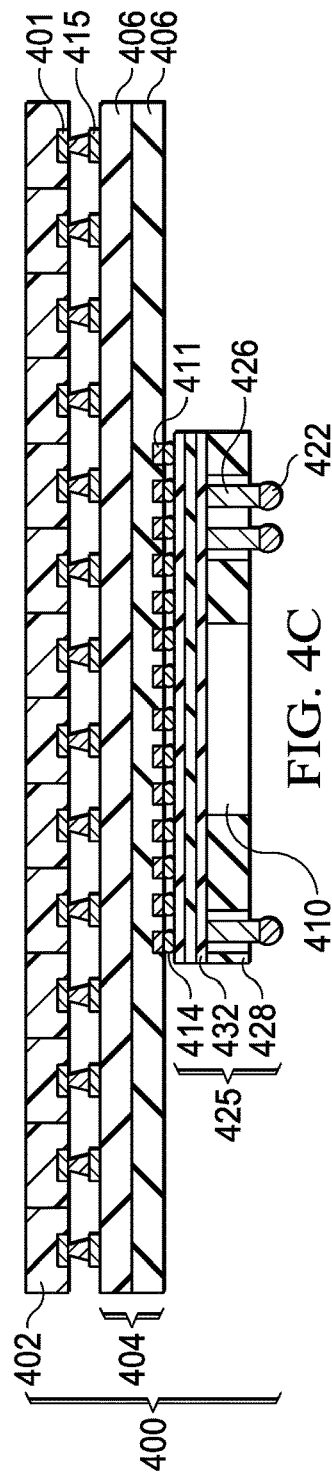

Photon detector arrays 402, such as the one illustrated in FIGS. 4A-4C, come in a variety of pixel sizes and pixel arrangements. In a particular case it may not be cost effective to custom build a dedicated die carrier 425 for each manufacturer's photon detector array 402 or for different sized photon detector arrays 402. Use of the arrangements in FIG. 4A-4C provides cost effective solutions by using an interposer 404 that can couple the same die carrier 425 to photon detector arrays 402 from various manufacturers or to photon detector arrays having different pitch or form factors, including photon detector arrays with different configurations. The use of the arrangements advantageously provides a reusable die carrier 425 with the ROIC semiconductor die 410. By changing the mapping of interposer 404, a relatively low-cost component, the die carrier 425 and the ROIC die 410 can be used with various photon detector arrays 402, without change.

FIGS. 4A through 4D illustrate an arrangement where an interposer 404 is used to match the inputs of a conductor layer 430 on a die carrier 425 to the signal output pads (conductive lands 401) of a photon detector array 402. When an interposer 404 is used, the number of interconnect levels 432 in the conductor layer 430 (versus the number of interconnect layers 406 in the interposer 404) can be adjusted to minimize cost and maximize performance. In addition, the size of the die carrier 425 can also be chosen to minimize cost and maximize performance. There must be a sufficient number of levels 432 in the conductor layer 430 to reduce signal lead-to-lead capacitive coupling to an acceptable level. The number of interconnect levels 406 in the interposer 404 required to match the signal input bond pad pitch on the conductor layer 430 in the die carrier 425 to the signal output bond pad (conductive lands 401) pitch on the photon detector array 402 is then determined. The lead to lead capacitance in conductor layer 430 is lower than that in the interposer 404 (due to the difference in wafer manufacturing technology and interposer technology) for the same number of interconnect levels, so a design tradeoff can be made to achieve a cost effective, low capacitance mapping from the input solder balls 414 on the conductor layer 430 in the die carrier 425 to the conductive lands 401 on photon detector array 402. The interposer 404 is formed using packaging technology, such as forming signal traces over a core such as a printed circuit board, laminate, or film (see step 513, in FIG. 5.)

As the size of a die carrier 425 increases, the number of die carriers 425 made per reconstituted wafer decreases. This increases cost of each die carrier 425. However, larger die carriers 425 can also integrate more passive devices and more signal processing ICs into the die carrier 425 in addition to the ROIC die 410. Moving electrical components from a system circuit board into a die carrier 425 can reduce the overall final cost of the system, can improve system performance, and can reduce system power requirements.

Figure 4D:
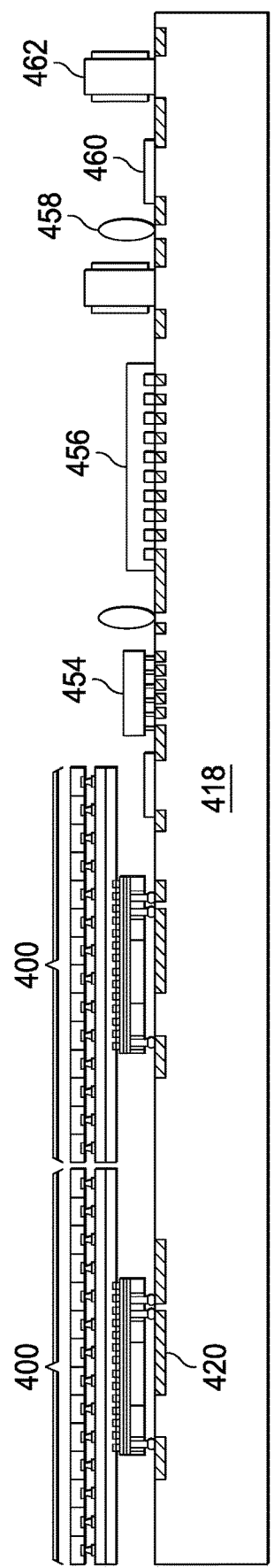

In assembling the photon detector 400 in FIGS. 4B-4D, the interposer 404 can first be mounted to the conductor layer 430 of the die carrier 425 (FIG. 4B, step 515 in FIG. 5) using, for example, a thermal solder reflow process. The solder bumps 414 on the conductor layer 430 can be aligned and placed in contact with the pads 411 on the bottom surface (as oriented in FIGS. 4A-4D) of the interposer 404. The solder bumps 414 can then be caused to melt and reflow in a thermal reflow process. As the solder then cools and hardens, the solder will form solder joints to bond the conductive pads 411 on the bottom surface of interposer 404 to the conductors on the upper surface (as oriented in FIGS. 4A-4D) of the conductor layer 430 on die carrier 425. The photon detector array 402 can then be bonded to the interposer 404 (FIG. 4C) using, for example, a gold to gold bond, in the example when the stud bumps 415 are gold and the conductive lands 401 on the photon detector 402 are also gold. This bonding process can advantageously be performed at a lower temperature than a solder reflow process, lower temperatures are a process requirement for certain types of photon detectors.

Figure 5:
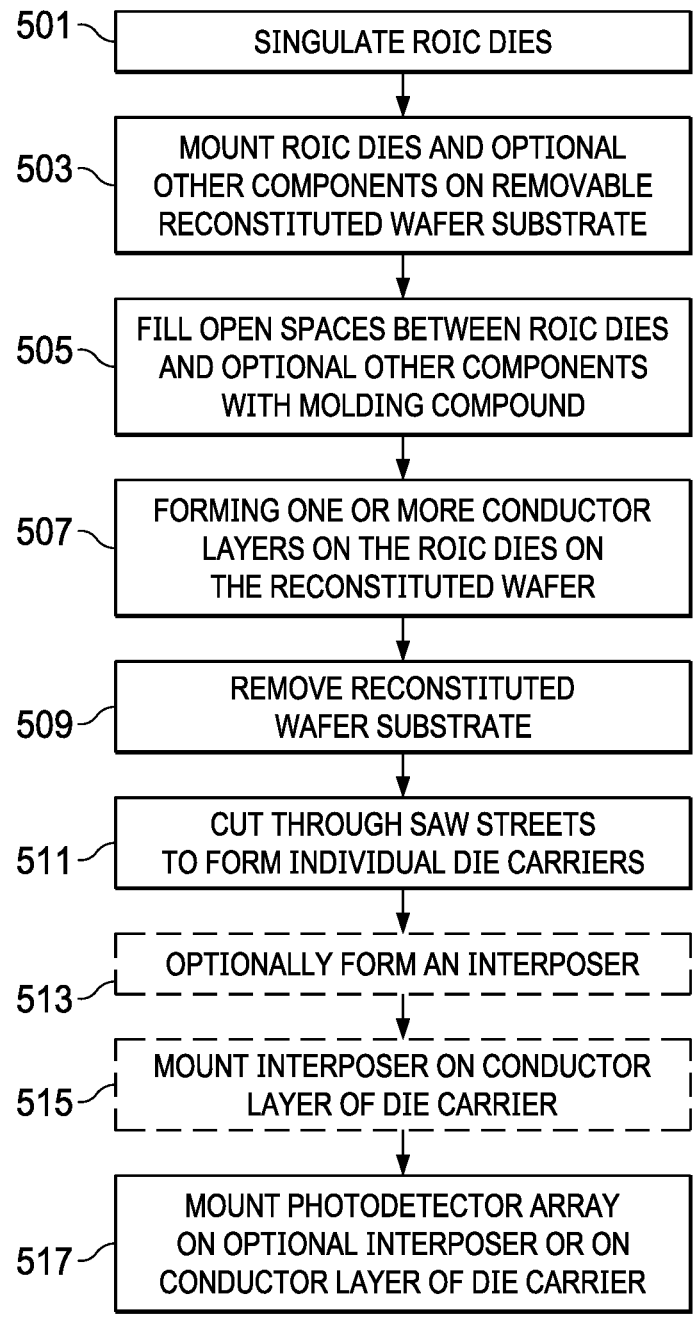
FIG. 5 is a flow diagram with descriptions of the manufacturing steps to form an apparatus with a photon detector array assembly with a die carrier including an integrated circuit and a conductor layer.

In FIG. 4D, several photon detectors 400, plus other electrical devices such as inductors 462, resistors 460, and integrated circuits 454 and 456 can be mounted on the leads 420 of a circuit board 418 (see FIG. 5, step 517). The circuit board 418 can be part of an imaging system. Useful examples where the arrangements can be used include a CT scanner, an X-ray machine, a video capture device, time of flight or ranging device, a telescope, industrial controls, site monitoring, or a video or still camera system.

Modifications are possible in the described arrangements, and other alternative arrangements are possible within the scope of the claims.

What is claimed is:

1. A method, comprising:
   attaching read out integrated circuit (ROIC) dies and through leads on a substrate;
   filling spaces on the substrate with a mold compound;
   forming a first layer on the ROIC dies, the through leads, and the mold compound, the first layer including a dielectric layer and conductors that couple bond pads of the ROIC dies to signal input pads on the first layer;
   forming conductive members on the signal input pads;
   removing the substrate; and
   cutting through the first layer and the mold compound to form die carriers, wherein each die carrier includes at least one of the ROIC dies and one or more of the through leads and wherein a pitch of the conductors in the first layer close to the ROIC dies is smaller than a pitch of the conductors in the first layer close to the signal input pads.

2. The method of claim 1, further comprising:
   coupling signal output pads on a photon detector to the signal input pads on the first layer.

3. The method of claim 1, further comprising:
   attaching at least one second electrical device on the substrate; and
   coupling the at least one second electrical device to at least one of the ROIC dies with at least one of the conductors in the first layer.

4. The method of claim 1, further comprising:
   matching positions of the signal input pads on the first layer to signal output pads of a photon detector array; and
   coupling the signal output pads of the photon detector array to the signal input pads on the first layer.

5. The method of claim 1, wherein the signal input pads on the first layer are first signal input pads and wherein the conductive members on the signal input pads are first conductive members, the method further comprising:
   forming an interposer including at least one wiring layer;
   forming second signal input pads on a first surface of the interposer;
   forming second conductive members on the second signal input pads;
   forming signal output pads on a second surface of the interposer, the second surface opposite the first surface, wherein positions of the signal output pads correspond to positions of the first signal input pads;
   coupling the second signal input pads to the signal output pads using wires in the at least one wiring layer; and
   using the first conductive members on the first signal input pads to form first interconnects between the signal output pads and the first signal input pads.

6. The method of claim 5, further comprising:
   matching positions of the second signal input pads to positions of signal output pads of a photon detector array; and
   forming second interconnects between the signal output pads of the photon detector array and the second signal input pads.

7. The method of claim 5, wherein the second conductive members include solder balls.

8. The method of claim 5, wherein the second conductive members include stud bumps having gold, silver, palladium, copper, or an alloy thereof.

9. The method of claim 5, wherein the interposer includes an organic material.

10. The method of claim 5, wherein the interposer includes a semiconductor material.

11. The method of claim 1, further comprising:
coupling the through leads to the ROIC dies with at least one of the conductors in the first layer.

12. The method of claim 1, wherein the through leads are formed prior to attaching on the substrate.

13. The method of claim 1, further comprising:
forming solder balls on surfaces of the through leads.

14. The method of claim 1, wherein the conductive members include solder balls.

15. The method of claim 1, wherein the conductive members include stud bumps having gold, silver, palladium, copper, or an alloy thereof.

16. The method of claim 1, wherein the dielectric layer contacts the mold compound.

17. A method, comprising:
mounting read out integrated circuit (ROIC) dies on a substrate;
filling spaces between the ROIC dies with a mold compound;
forming a first layer on the ROIC dies and the mold compound, the first layer including a dielectric layer and conductors that couple bond pads of the ROIC dies to first signal input pads on the first layer;
forming first conductive members on the first signal input pads;
removing the substrate;
cutting the first layer and the mold compound between the ROIC dies;
providing an interposer including at least one wiring layer, the interposer having;
second signal input pads on a first surface of the interposer; and
signal output pads on a second surface of the interposer, the second surface opposite the first surface, wherein wires in the at least one wiring layer couple the second signal input pads to the signal output pads;
forming second conductive members on the second signal input pads; and
forming first conductive pathways between the signal output pads and the first signal input pads using the first conductive members.

18. The method of claim 17, wherein positions of the signal output pads are matched to positions of the first signal input pads.

19. The method of claim 17, wherein positions of the second signal input pads are matched to positions of signal output pads of a photon detector array.

20. The method of claim 19, further comprising:
forming second conductive pathways between the signal output pads of the photon detector array and the second signal input pads using the second conductive members.

21. The method of claim 17, further comprising mounting through leads on the substrate.

22. The method of claim 21, wherein the ROIC dies and the through leads are in contact with an adhesive layer on the substrate.

23. The method of claim 21, further comprising:
coupling the through leads to the ROIC dies with at least one of the conductors in the first layer.

24. The method of claim 21, wherein the through leads are formed prior to mounting on the substrate.

25. The method of claim 21, further comprising:
forming solder balls on surfaces of the through leads.

26. The method of claim 17, further comprising mounting second electrical devices on the substrate.

27. The method of claim 26, further comprising:
coupling the second electrical devices to the ROIC dies with at least one of the conductors in the first layer.

28. A method, comprising:
attaching an integrated circuit (IC) die and one or more through leads on a substrate;
filling spaces on the substrate with a mold compound;
forming a first layer on the IC die, the one or more through leads, and the mold compound, the first layer including a dielectric layer and conductors that couple bond pads of the IC die to conductive pads on the first layer; and
removing the substrate, wherein the IC die, the one or more through leads, and the first layer form a die carrier and wherein a pitch of the conductors in the first layer close to the IC die is smaller than a pitch of the conductors in the first layer close to the conductive pads.

29. The method of claim 28, further comprising:
forming conductive members on the conductive pads.

30. The method of claim 28, further comprising:
coupling the one or more through leads to the IC die with at least one of the conductors in the first layer.

31. The method of claim 28, further comprising:
forming conductive members on surfaces of the one or more through leads.

32. The method of claim 28, wherein the conductive pads on the first layer are first conductive pads, the method further comprising:
aligning the first conductive pads to second conductive pads of a photon detector array; and
forming conductive pathways connecting the first conductive pads to the second conductive pads.

33. The method of claim 28, wherein the conductive pads on the first layer are first conductive pads, the method further comprising:
providing an interposer including a wiring layer, the interposer including;
second conductive pads on a first surface of the interposer; and
third conductive pads on a second surface of the interposer, the second surface opposite the first surface, wherein the wiring layer couples the second conductive pads to the third conductive pads.

34. The method of claim 33, further comprising:
aligning the third conductive pads to the first conductive pads; and
forming conductive pathways connecting the third conductive pads to the first conductive pads.

35. The method of claim 34, wherein the conductive pathways are first conductive pathways, the method further comprising:
aligning the second conductive pads to fourth conductive pads of a photon detector array; and
forming second conductive pathways connecting the second conductive pads to the fourth conductive pads.

* * * * *